(12) United States Patent
Göötz et al.

(10) Patent No.: US 10,008,639 B2
(45) Date of Patent: Jun. 26, 2018

(54) METHOD FOR PRODUCING OPTOELECTRONIC SEMICONDUCTOR COMPONENTS AND OPTOELECTRONIC SEMICONDUCTOR COMPONENT

(71) Applicant: OSRAM Opto Semiconductors GmbH, Regensburg (DE)

(72) Inventors: Britta Göötz, Regensburg (DE); Frank Singer, Regenstauf (DE); Lutz Höppel, Alteglofsheim (DE); Jürgen Moosburger, Lappersdorf (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 0 days. days.

(21) Appl. No.: 15/120,457

(22) PCT Filed: Feb. 20, 2015

(86) PCT No.: PCT/EP2015/053602

§ 371 (c)(1),
(2) Date: Aug. 19, 2016

(87) PCT Pub. No.: WO2015/124719

PCT Pub. Date: Aug. 27, 2015

(65) Prior Publication Data

US 2017/0069800 A1    Mar. 9, 2017

(30) Foreign Application Priority Data

Feb. 21, 2014    (DE) .................. 10 2014 102 293

(51) Int. Cl.
*H01L 33/48* (2010.01)
*H01L 33/00* (2010.01)
*H01L 33/52* (2010.01)
(Continued)

(52) U.S. Cl.
CPC .......... *H01L 33/486* (2013.01); *H01L 33/005* (2013.01); *H01L 33/505* (2013.01);
(Continued)

(58) Field of Classification Search
CPC ..... H01L 33/486; H01L 33/62; H01L 33/505; H01L 33/005; H01L 33/52;
(Continued)

(56) References Cited

U.S. PATENT DOCUMENTS 6,468,821 B2    10/2002    Maeda et al.
6,696,704 B1    2/2004    Maeda et al.
(Continued)

FOREIGN PATENT DOCUMENTS

DE    10245946 C1    10/2003
DE    10250911 A1    6/2004
(Continued)

*Primary Examiner* — Michael Carter
*Assistant Examiner* — Mohammed R Alam
(74) *Attorney, Agent, or Firm* — Slater Matsil, LLP

(57) ABSTRACT

A method for producing optoelectronic semiconductor components (100) is specified, wherein a carrier (1) having a carrier main side (11) is provided. Furthermore, a plurality of singulated optoelectronic semiconductor chips (2) are provided, wherein the semiconductor chips (2) each have a main emission side (21) and a contact side (22) opposite the main emission side (21). The singulated semiconductor chips (2) are then applied to the carrier main side (11), such that the contact side (22) in each case faces the carrier main side (11). In regions between the semiconductor chips, a mask frame (3) is applied, wherein the mask frame (3) is a grid of partitions (31). In a plan view of the carrier main side (11), each semiconductor chip (2) is surrounded all around by the partitions (31). The semiconductor chips (2) are potted with a conversion material (4) such that a conversion element (41) is respectively formed on the semiconductor (Continued)

Figure 1D:
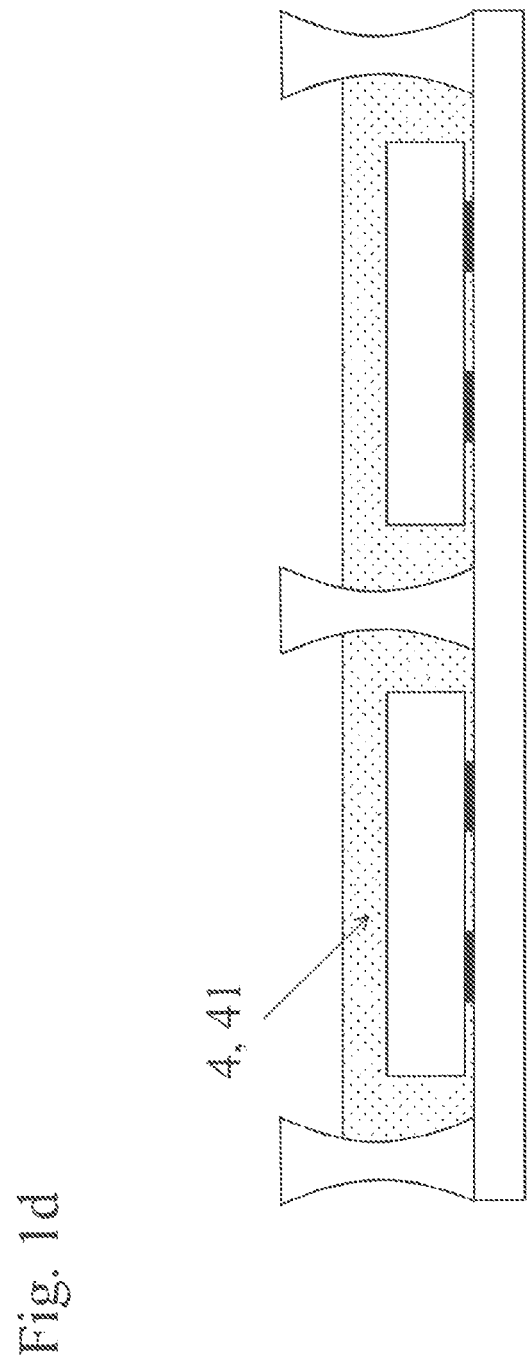

chips (2). In this case, the conversion element (41) at least partly covers the main emission side (21) of the respective semiconductor chip (2). The carrier (1) is then removed. In a further step, the optoelectronic semiconductor components (100) are detached from the mask frame (3), the mask frame (3) being destroyed.

14 Claims, 17 Drawing Sheets

(51) Int. Cl.
*H01L 33/50* (2010.01)
*H01L 33/62* (2010.01)

(52) U.S. Cl.
CPC ............ *H01L 33/52* (2013.01); *H01L 33/62* (2013.01); *H01L 2933/0033* (2013.01); *H01L 2933/0041* (2013.01); *H01L 2933/0066* (2013.01)

(58) Field of Classification Search
CPC ..... H01L 2933/0041; H01L 2933/0066; H01L 2933/0033
See application file for complete search history.

(56) References Cited

U.S. PATENT DOCUMENTS

| | | | |
|---|---|---|---|
| 8,723,192 | B2 | 5/2014 | Weidner et al. |
| 9,269,873 | B2 | 2/2016 | Imazu et al. |
| 2011/0175117 | A1* | 7/2011 | Jagt .................. H01L 33/44 257/88 |
| 2016/0079489 | A1 | 3/2016 | Richter et al. |

FOREIGN PATENT DOCUMENTS

| | | | |
|---|---|---|---|
| DE | 102007043183 A1 | | 4/2009 |
| DE | 102007053067 | * | 4/2009 |
| DE | 102007053067 A1 | | 4/2009 |
| DE | 102009036621 A1 | | 2/2011 |
| DE | 102010046257 A1 | | 3/2012 |
| DE | 102013103983 A1 | | 11/2014 |
| JP | 2000208822 A | | 7/2000 |
| JP | 2012248672 A | | 12/2012 |
| JP | WO2013137356 A1 | | 8/2015 |

\* cited by examiner

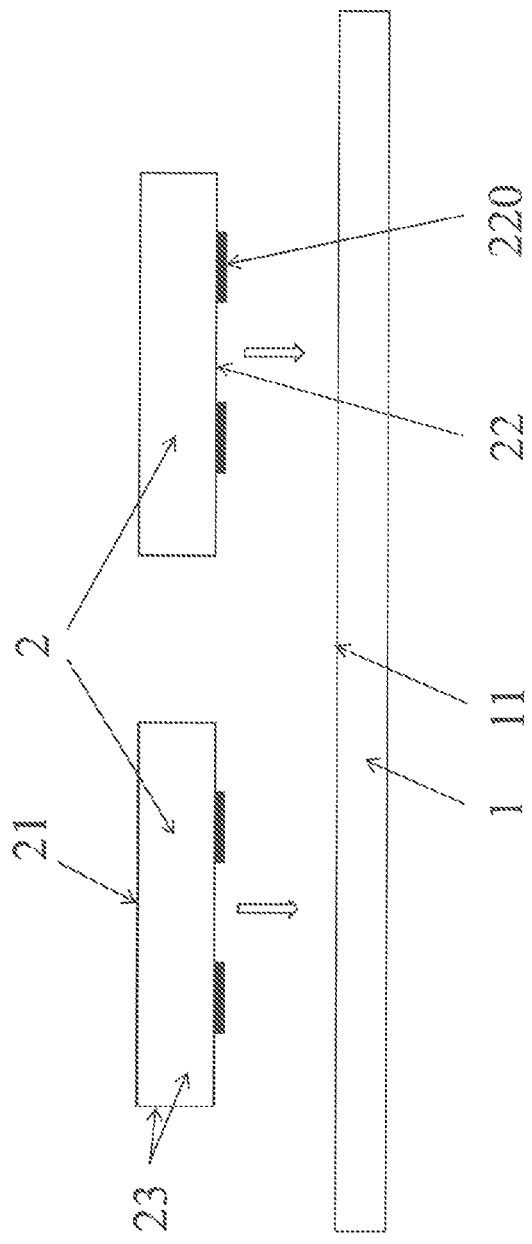

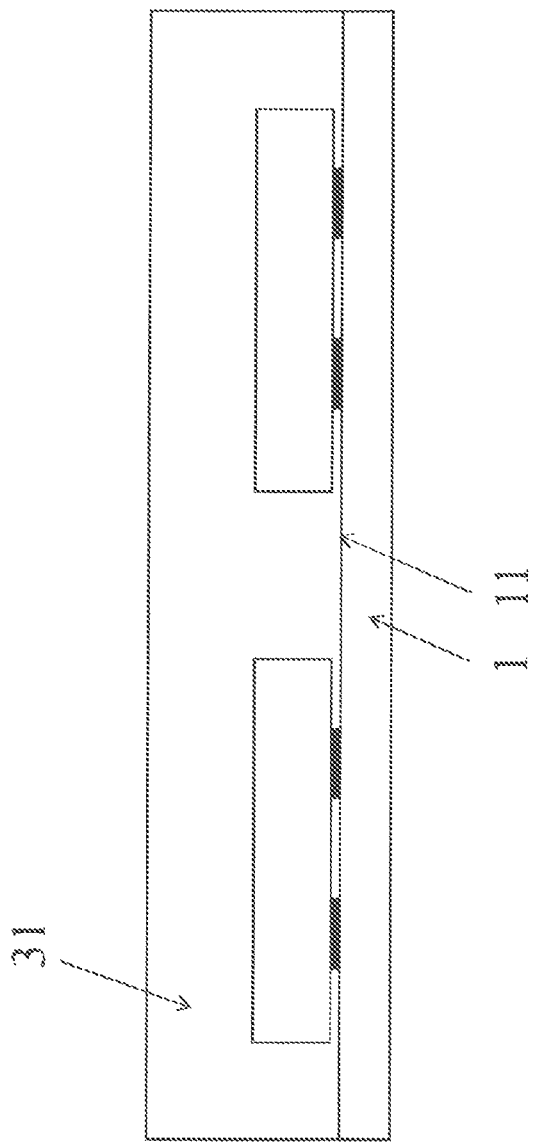

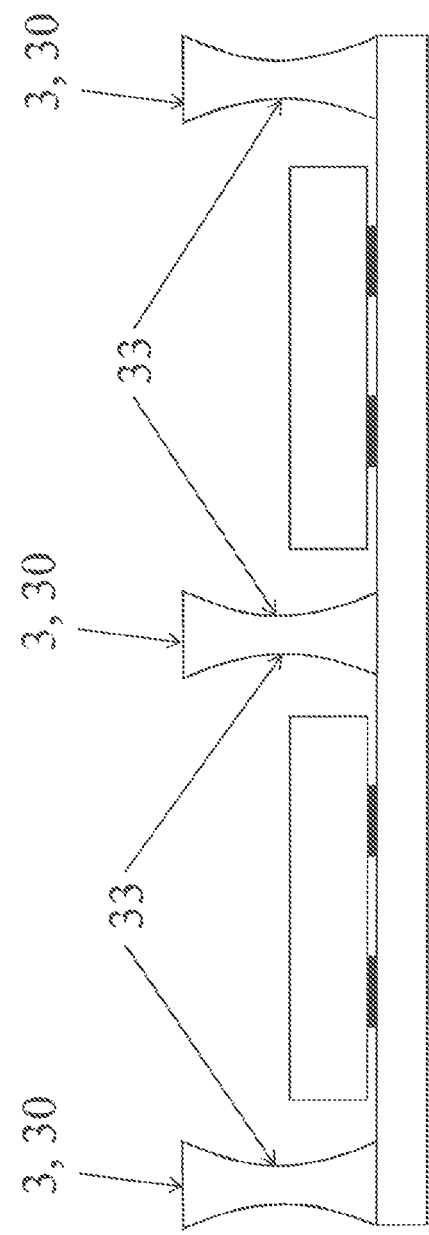

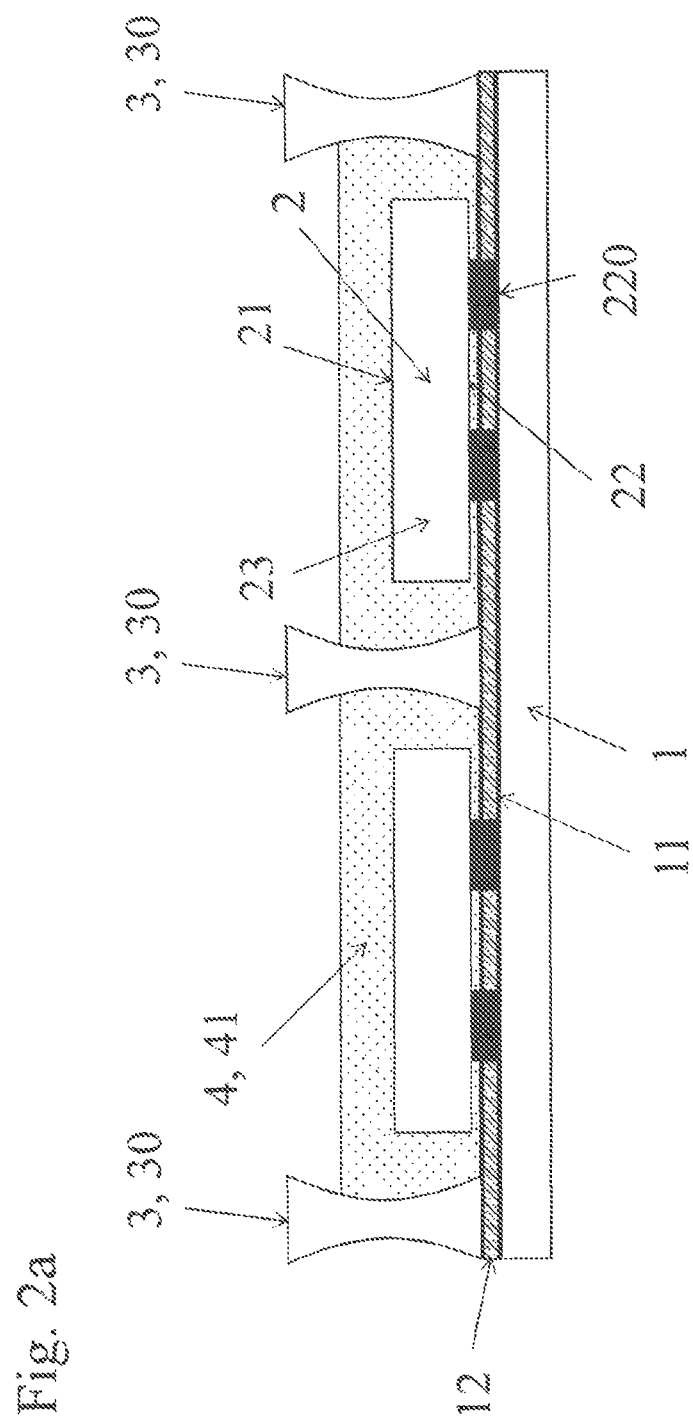

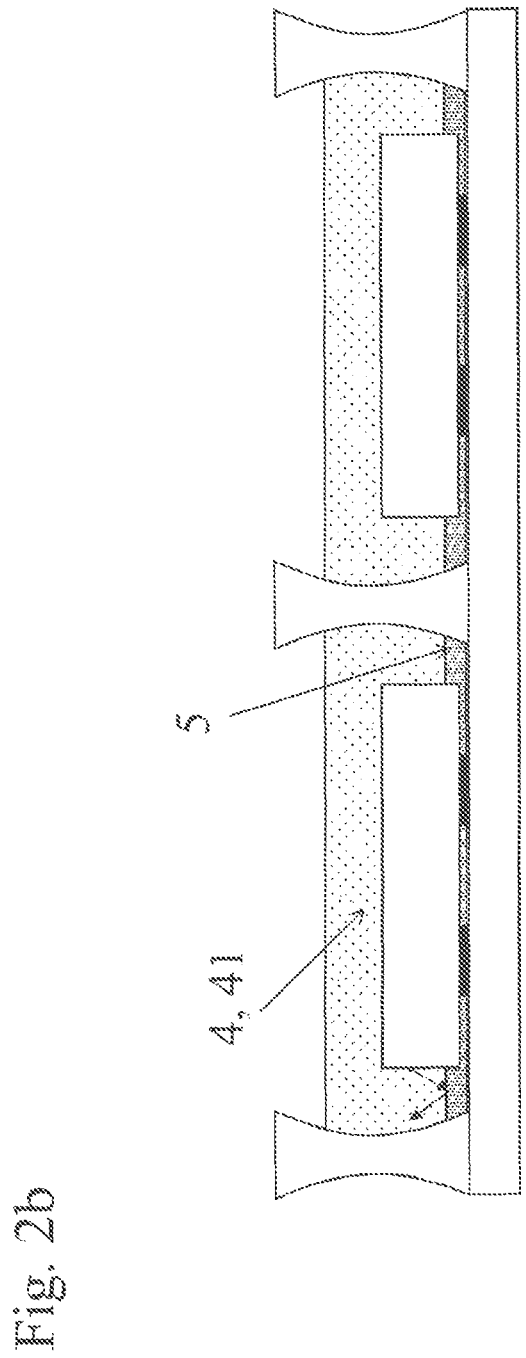

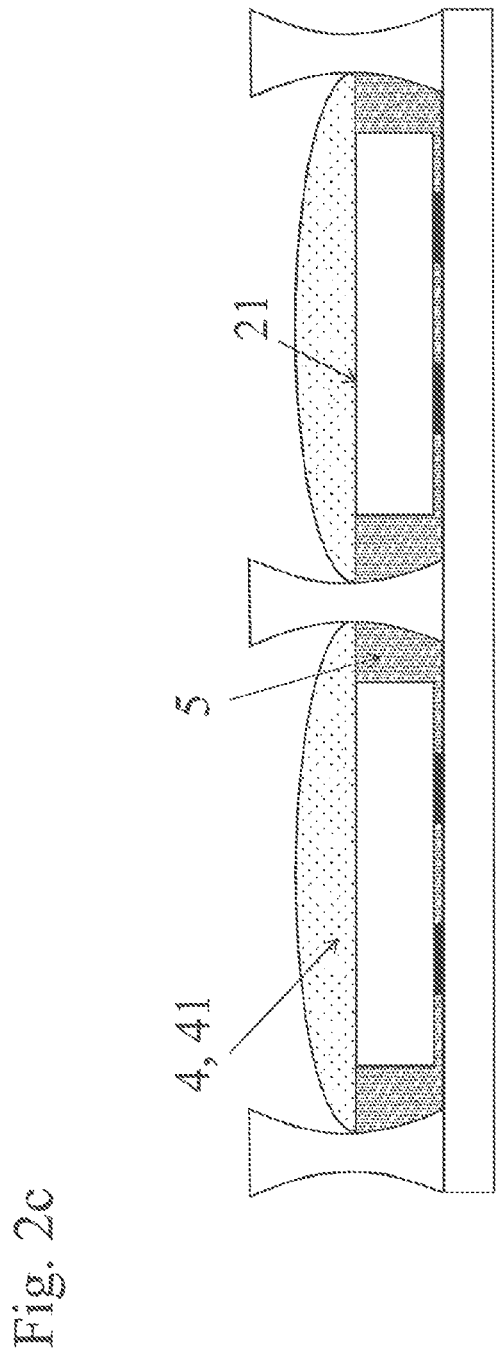

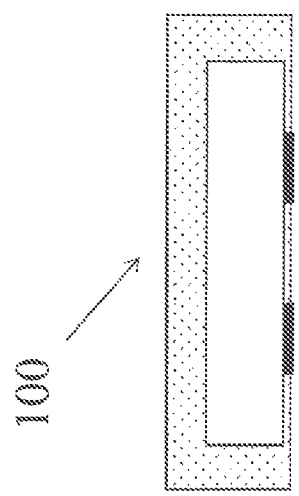
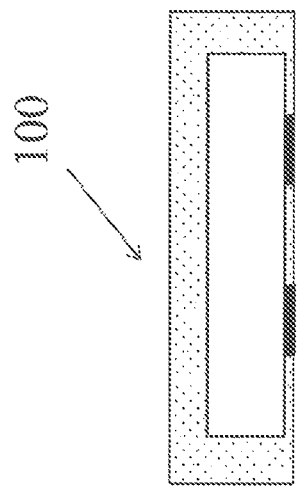
Fig. 3b

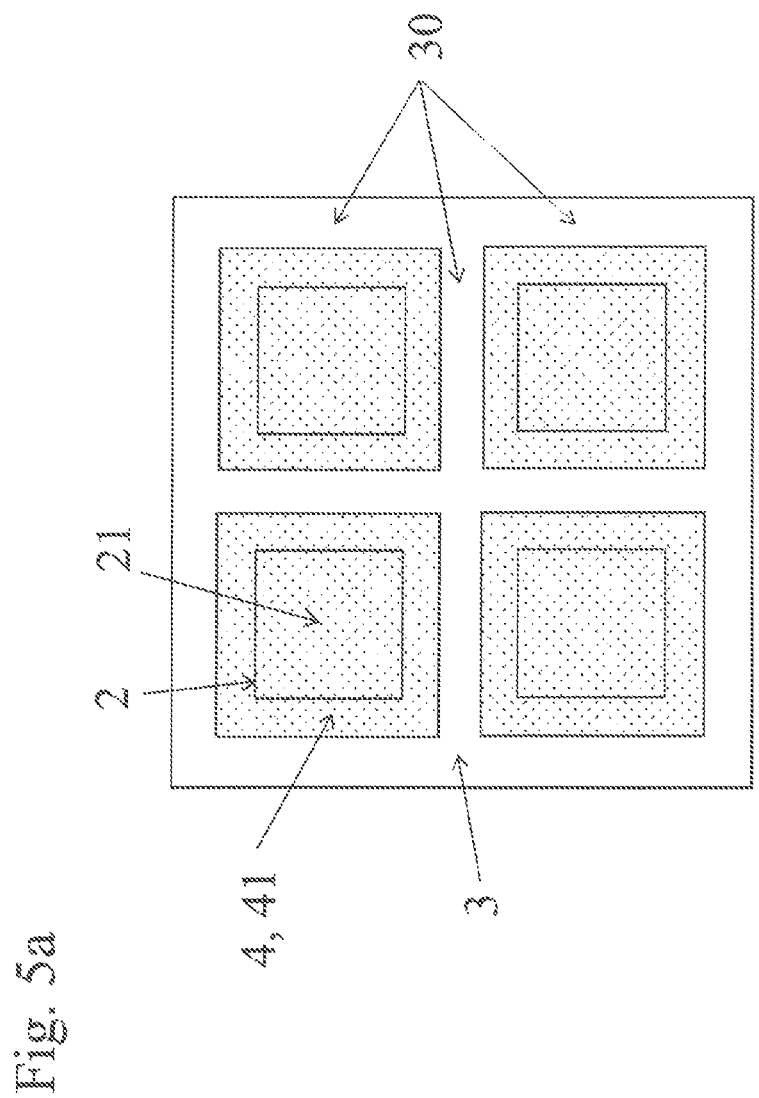

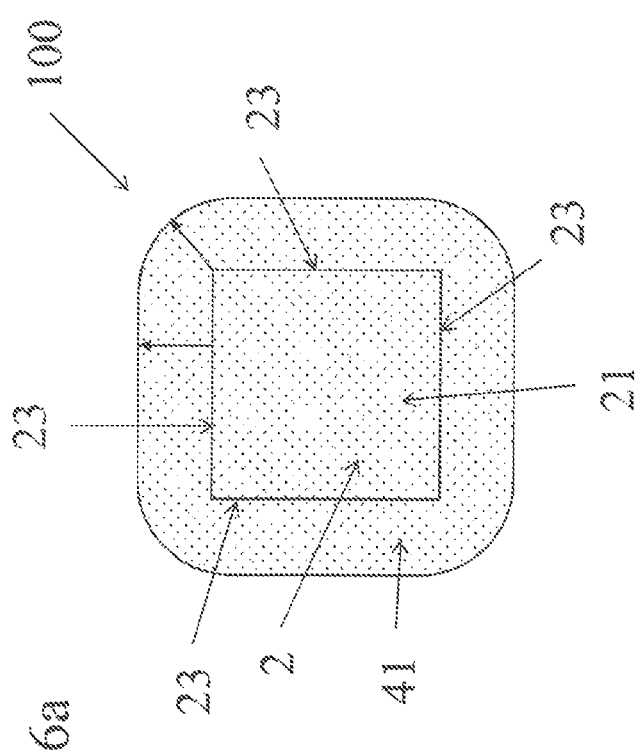

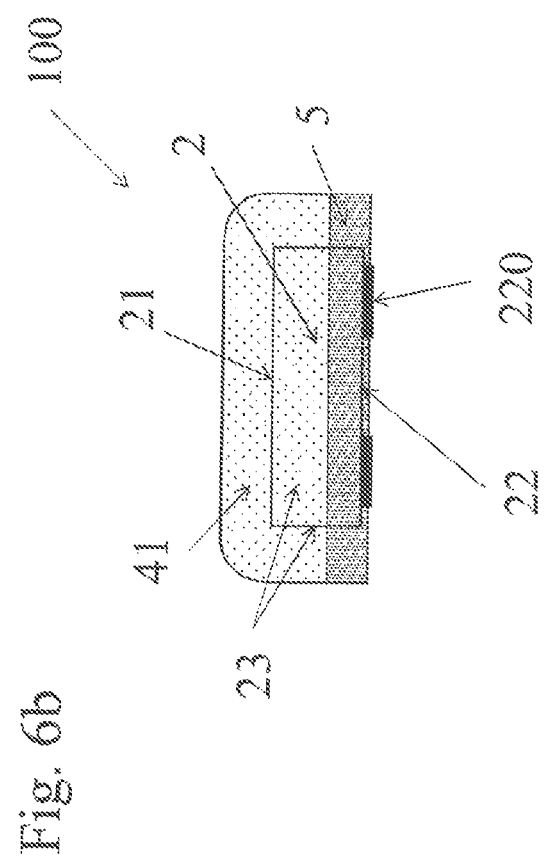

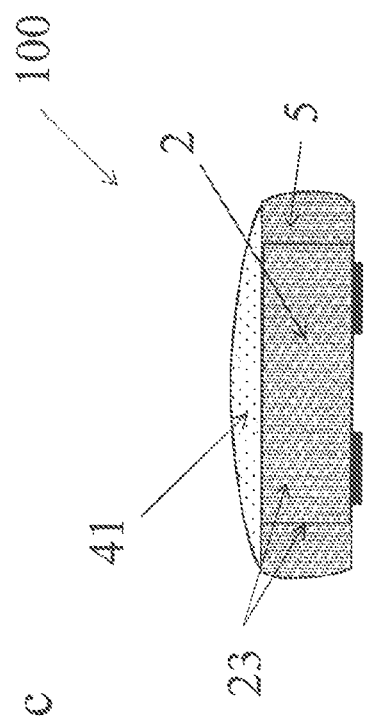

METHOD FOR PRODUCING OPTOELECTRONIC SEMICONDUCTOR COMPONENTS AND OPTOELECTRONIC SEMICONDUCTOR COMPONENT

A method is provided for producing optoelectronic semiconductor components. An optoelectronic semiconductor component is also provided.

One object to be achieved consists in providing a method for the simplest and most efficient possible production of optoelectronic semiconductor components with uniform light outcoupling. A further object to be achieved consists in providing an optoelectronic semiconductor component with uniform light outcoupling.

These objects are achieved inter alia by a method for producing optoelectronic semiconductor components and by an optoelectronic semiconductor component according to the independent claims. Advantageous configurations and further developments constitute the subject matter of the dependent claims.

According to at least one embodiment of the method, a carrier with a main carrier side is provided. The carrier may for example be a sapphire carrier or a metallic carrier or a carrier of a plastics material.

According to at least one embodiment of the method, one or more individual optoelectronic semiconductor chips are provided. The semiconductor chips here preferably each have a main emission side and a contact side opposite the main emission side. Light generated by the semiconductor chip may be coupled out of the semiconductor chip via the main emission side. The contact side preferably serves in electrical contacting of the semiconductor chip. No light is here coupled out of the semiconductor chip via the contact side. The main emission side and the contact side are connected together by side faces. The side faces here extend transversely to the main emission side and may, like the main emission side, be provided for light outcoupling.

The semiconductor chip preferably comprises one or more semiconductor layer sequences. The at least one semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, i.e. Al, As, Ga, In, N or P, even if these may in part be replaced and/or supplemented by small quantities of further substances.

The semiconductor chips for example have a lateral extent along the main emission side of at least 250 μm or 400 μm or 600 μm. Alternatively or in addition, the lateral extent is at most 2000 μm or 1100 μm or 700 μm. The height of the semiconductor chips, measured perpendicular to the main emission side, preferably amounts to at least 5 μm or 50 μm or 200 μm. Alternatively or in addition, the height of the semiconductor chips is ≤400 μm or ≤350 μm or ≤300 μm.

According to at least one embodiment of the method, the singulated semiconductor chips are applied to the main carrier side in such a way that in each case the contact side of a semiconductor chip faces the main carrier side. The contact side may here lie directly on the main carrier side or be separated from the main carrier side by intermediate layers.

According to at least one embodiment of the method, a mask frame is applied at least in regions between the semiconductor chips. The mask frame is here a grid of a plurality of intersecting partition walls. The partition walls are provided to separate the semiconductor chips from one another. In plan view onto the main carrier side, after application of the mask frame each semiconductor chip or indeed groups of semiconductor chips is/are partially or completely surrounded by the partition walls of the mask frame. The partition walls may be arranged for example in a rectangular or hexagonal grid, such that the semiconductor chips are each surrounded by a rectangular or hexagonal frame of partition walls.

According to at least one embodiment of the method, the semiconductor chips are then potted with a conversion material, such that a layer of the conversion material is in each case deposited on the semiconductor chips, which layer is then formed into a conversion element. In this case, the conversion element partially or completely covers at least the main emission side of the respective semiconductor chip. The assembly of optoelectronic semiconductor chip and conversion element is here and hereinafter described as an optoelectronic semiconductor component.

The thickness of the layer of conversion material on the semiconductor chip preferably amounts to at most 20 μm or 50 μm or 100 μm. Alternatively or in addition, the thickness of the conversion element is ≤250 μm or ≤200 μm or ≤150 μm. The thickness of the layer is here in each case measured perpendicular to the surface of the semiconductor chip onto which the layer of the conversion material is applied.

For potting of the semiconductor chips with the conversion material, the conversion material may for example be applied onto the mask frame and pressed into the intermediate regions between the partition walls and onto the semiconductor chips by means of a pressing method, for example by means of a squeegee. In addition, it is possible for the conversion material to be a liquid or high viscosity material which is applied on the mask frame and then flows independently, without external pressure, into the regions between the partition walls and there spreads on the semiconductor chips. The respective conversion element then arises for example in that the conversion material is dried or cured.

According to at least one embodiment of the method, after application of the conversion material the carrier is removed. Through removal of the carrier, the contact sides of the semiconductor chips are preferably at least partly exposed. In particular, those regions of the contact sides are exposed which must be free for actual contacting of the semiconductor chip. For removal of the carrier, the carrier may for example be eroded layer-by-layer, dissolved by way of a chemical process or peeled off the semiconductor chips in one piece.

According to at least one embodiment of the method, the optoelectronic semiconductor components are then removed from the mask frame. During detachment, the mask frame may be destroyed. For example, the mask frame may be detached or dissolved by means of a solvent. It is alternatively also possible for the individual partition walls of the mask frame to be broken up or apart. On detachment of the semiconductor components, the mask frame is advantageously completely removed, such that the semiconductor components are then free of the mask frame. Detachment from the mask frame and/or destruction of the mask frame may also take place through detachment of the carrier.

In at least one embodiment of the method for producing optoelectronic semiconductor components, a carrier with a main carrier side is provided. Furthermore, one or more individual optoelectronic semiconductor chips are provided, wherein the semiconductor chips each comprise a main emission side and a contact side opposite the main emission side. The contact side is here designed for electrical contacting of the semiconductor chip. The singulated semiconductor chips are then applied to the main carrier side, such that in each case the contact side faces the main carrier side. In addition, a mask frame is applied at least in regions between the semiconductor chips, wherein the mask frame is a grid of partition walls. In plan view onto the main carrier side, each semiconductor chip is surrounded all round by the partition walls of the mask frame. In a further step, the semiconductor chips are potted with a conversion material such that a conversion element forms in each case on the semiconductor chips. The conversion element in this case at least partly covers the main emission side of the respective semiconductor chip. Then the carrier is removed, wherein the contact sides of the semiconductor chips are at least partly exposed. In a further step, the optoelectronic semiconductor components are detached from the mask frame, wherein the mask frame is destroyed.

With the method described here, a plurality of optoelectronic semiconductor components may be produced particularly simply and efficiently. Since the mask frame is applied as a sacrificial structure, which may be destroyed on detachment of the semiconductor components, the shapes of the conversion elements on the semiconductor chips may be freely designed. Furthermore, the singulation process for the semiconductor components through destruction of the mask frame is particularly simple. The various semiconductor components do not have to be separated from one another either by sawing or a laser-based separating method. In this way, the risk of damage or contamination of the semiconductor chips and/or of the conversion elements in the singulation process is reduced. Advantageously, therefore, conversion materials with sensitive luminescent materials may also be used in the method described here.

According to at least one embodiment of the method, intermediate steps are performed for application of the mask frame. In a first intermediate step, a layer of an organic mask material is applied on and between the semiconductor chips. The mask material here preferably completely covers the side faces and the main emission side of each semiconductor chip. The organic mask material is preferably a self-curing, for example heat-curing organic material. In particular, the mask material may be a photosensitive coating material. The thickness of the mask layer, measured perpendicular to the main carrier side, amounts for example to at least 100 μm or 200 μm or 500 μm. Alternatively or in addition, the thickness of the mask layer is ≤1000 μm or ≤800 μm or ≤700 μm.

According to at least one embodiment of the method, the layer of mask material is patterned. As a result of the patterning, the semiconductor chips are at least partially exposed, so resulting in the mask frame surrounding the semiconductor chips. The patterning may here proceed for example using free space optics, or LDI for short. To form partition walls with curved side faces or flanks, the layer of mask material may also consist of a plurality of individual layers, which for example have different light sensitivities. For example, the layer of mask material to this end comprises both positive and negative photoresists, i.e. photoresists which become both soluble and insoluble on exposure.

Alternatively, however, it is also possible to produce the mask frame using a 3D printing method.

According to at least one embodiment of the method, the mask material is cured after application. After curing, the mask material is preferably dimensionally stable and/or rigid and/or brittle and/or breakable. Dimensionally stable is here for example understood to mean that the mask frame made from the mask material is not deformed by mechanical loading, as may for example occur on application of the conversion material using a printing method. In particular, the mask frame is durably dimensionally stable, i.e. at least during application of the conversion material, preferably until the mask frame is destroyed.

On patterning of the layer of mask material, the distance between the resultant partition walls and the side faces of the semiconductor chips may advantageously be adjusted to well-defined, in particular constant values. To this end, prior to patterning of the mask layer the position of each semiconductor chip on the carrier may be measured. This for example allows the production of a mask frame with individual thicknesses and orientation adaptations of the partition walls.

According to at least one embodiment of the method, the partition walls of the mask frame comprise flanks. The flanks here extend transversely of the main carrier side of the carrier and in each case face one or more semiconductor chips. The flanks of the partition walls may be planar or flat, the flanks then not exhibiting any curvature. Alternatively, it is possible for the flanks to exhibit curvature, for example concave curvature. Concave curvature is understood for example to mean that the width of the partition walls firstly decreases in the direction away from the main carrier side and then increases again. Likewise, the width of the partition walls may increase or decrease monotonically in the direction away from the carrier or indeed firstly increase and then decrease.

For example, a or each partition wall comprises, or a plurality thereof comprise, a minimum width in a middle region of the partition wall. Furthermore, the partition wall may comprise a first maximum width at a lower end of the partition wall facing the main carrier side. At an upper end of the partition wall remote from the main carrier side, the partition wall for example has a second maximum width. The minimum width is for example at least 70% or 50% or 20% of the first and/or second maximum width. The first and second maximum widths preferably deviate from one another by less than 20% or 10% or 5%. The middle region is in this case arranged for example at a height measured from the main carrier side which amounts to at least 30% or 40% or 50% of the total height of the partition wall. Alternatively or in addition, the middle region is located for example at a height≤80% or ≤70% or ≤60% of the total height of the partition wall. The height of the partition wall is here defined as the extent of the partition wall perpendicular to the main carrier side.

According to at least one embodiment of the method, the partition walls of the mask frame are spaced laterally relative to the semiconductor chips, such that an interspace arises between the semiconductor chips and the partition walls in which the main carrier side is preferably exposed. In plan view onto the main carrier side, the semiconductor chips are surrounded at least in part, in particular completely, by the interspace.

On potting, the interspace is filled for example with the conversion material. The resultant conversion element partly or completely embraces the main emission sides and the exposed side faces of the respective semiconductor chip.

The term "embrace" means that the conversion element surrounds the semiconductor chip in form-fitting manner and is in direct contact with the semiconductor chip in places or over the entire surface.

Furthermore, the conversion element may at least partially embrace the flanks of the partition walls and in the process form-fittingly follow the shape of the flanks. In other words, the outer faces of the conversion element remote from the semiconductor chip then display at least partially the negative shape of the flanks of the partition walls. In particular, the shape of the outer faces of the conversion element is thus predetermined at least in part by the shape of the partition walls of the mask frame. A concave flank shape of the partition walls then results for example in a partly convexly shaped outer face of the conversion element.

According to at least one embodiment of the method, inner edges of the mask frame are partially or completely rounded. The inner edges of the mask frame in each case face at least one semiconductor chip and are formed by two intersecting partition walls extending transversely of one another. As a result of the rounded inner edges of the mask frame, it is possible to ensure that the conversion element has rounded outer edges.

According to at least one embodiment of the method, prior to application of the conversion material a reflective material is introduced into the interspaces between the semiconductor chips and the partition walls. In this case, the exposed side faces of the semiconductor chip are covered at least in part with a reflective layer. The reflective layer here preferably at least partly covers all the side faces of the semiconductor chip, such that in plan view onto the main carrier side the reflective layer forms a contiguous path around the semiconductor chip. Wetting the main emission side with the reflective material may for example be prevented by the use of a further mask, wherein the further mask protects the main emission sides of the semiconductor chips. Furthermore, the main emission sides of the semiconductor chips may be coated with a material which prevents wetting with the reflective material.

The reflective layer for example comprises silver or aluminum or platinum or consists of such a material. Furthermore, the reflective layer may comprise titanium oxide particles, which are for instance embedded in a silicone matrix material.

The reflective layer in particular covers the regions of the side faces adjoining the contact surface of the semiconductor chip. For example, the reflective layer extends on the side faces of the semiconductor chips from the contact side up to a height which amounts to at most 80% or 50% or 5% of the total height of the semiconductor chip. In particular, the reflective layer may however also completely cover the side faces and terminate flush with the main emission side of the semiconductor chip. The reflective layer ensures for example that light exiting from the semiconductor chip via the side walls is directed towards the main emission side.

The reflective layer may, like the conversion element, form-fittingly follow the shape of parts of the flanks of the partition walls of the mask frame. Thus, on the outer faces of the optoelectronic semiconductor component a flush transition preferably forms between reflective layer and conversion element, without notches or jumps or raised portions or gaps arising in the transitional region between the reflective layer and the conversion element.

According to at least one embodiment of the method, the conversion element does not comprise any seam structures. Seam structures are here understood to be raised portions or indentations in the conversion element, which result from the production process. Such seam points arise for example in injection molding procedures. The injection molding templates here often consist of two or more partial templates joined together. In the region of the contact face between the two partial templates, a small gap generally forms. On potting, this gap takes the form for example of a raised portion on the outer face of the conversion element. Since in the method described here the template is a one-piece, contiguous mask, such seam structures advantageously do not arise in the method described here.

According to at least one embodiment of the method, the mask frame or the partition walls comprise a height which is greater than the height of the semiconductor chips. The heights are each measured perpendicular to the main carrier side. The semiconductor chips are preferably potted with the conversion material only to the extent that the resultant conversion elements of two adjacent semiconductor chips are not contiguous. In particular, the total height of the semiconductor component with the conversion element applied thereto is thus less than the height of the mask frame.

According to at least one embodiment of the method, the conversion element is applied to the semiconductor chip in such a way that the resultant conversion element forms a dome-shaped and/or lenticular shape on the main emission side of the semiconductor chip. To achieve such a shape, the conversion material may comprise a thixotropic and/or high viscosity material, for example the viscosity of the conversion material on application is at least $10^2$ Pa·s or $10^3$ Pa·s or $10^4$ Pa·s.

According to at least one embodiment of the method, the carrier is an adhesive film. An adhesive layer is applied to the main carrier side of the adhesive film. The adhesive layer in this case has a thickness, for example, of at least 2 μm or 5 μm or 10 μm. Alternatively or in addition, the thickness of the adhesive layer is ≤50 μm or ≤30 μm or ≤20 μm.

According to at least one embodiment of the method, contact pads in the form of raised portions are applied to the contact side of the semiconductor chip. The contact pads are for example metallic and for example comprise silver or gold or aluminum. The thickness of the contact pads preferably amounts to at least 5 μm or 10 μm or 20 μm. Alternatively or in addition, the thickness of the contact pads is ≤50 μm or ≤40 μm or ≤30 μm. The contact pads are provided in particular for electrical contacting of the semiconductor chips.

According to at least one embodiment of the method, on application of the semiconductor chips to the adhesive film covered with the adhesive layer, the contact pads are pressed completely or partly into the adhesive layer. The contact pads may in this case for example penetrate at least 1 μm or 1.5 μm or 2 μm deep into the adhesive layer. Alternatively or in addition, the contact pads penetrate by no more than 5 μm or 4 μm or 3 μm into the adhesive layer. Advantageously, the contact pads are protected by the adhesive layer from the conversion material or reflective material applied subsequently. After peeling off of the adhesive film and singulation of the semiconductor components, the contact pads are then at least partly exposed. This allows subsequent contacting of the respective semiconductor component.

According to at least one embodiment of the method, in the method the regions of the contact surface arranged between the contact pads are at least partly covered with the conversion material or the reflective material. Alternatively, it is also possible for the contact surface to remain free of the conversion material or the reflective material. To achieve this, the regions between the contact pads may for example be coated with a material such as Teflon, which prevents wetting with the conversion material or the reflective material. It is furthermore conceivable that the semiconductor chip is pressed so far into the adhesive layer that all the regions of the contact side are covered with the adhesive layer and no gap arises between adhesive layer and contact surface.

According to at least one embodiment of the method, the conversion material comprises a matrix material. At least one organic or inorganic luminescent material, for example in the form of luminescent particles, is introduced into the matrix material. The matrix material may for example be an organic material such as a silicone or resin. The luminescent material is for example a ceramic luminescent material, such as a rare earth-doped yttrium aluminum garnet, YAG for short, or lutetium aluminum garnet, LUAG for short. Furthermore, the luminescent material may be a rare earth-doped alkaline earth metal silicon nitride or alkaline earth metal aluminum silicon nitride.

The luminescent particles are in particular provided to convert light of a first wavelength range emitted by the semiconductor chip at least partly into light of a second wavelength range. When in operation, the finished semiconductor component then for example emits mixed light with proportions of light of the first wavelength range and of the second wavelength range. For example, the semiconductor chip emits blue light or UV light, which is absorbed by the luminescent particles and converted into greenish-yellow or red-orange light. The mixed light emitted by the semiconductor component is for example white light.

An optoelectronic semiconductor component is furthermore provided. The optoelectronic semiconductor component described here may be produced using the method described here. In other words, all the features disclosed in relation to the production method are also disclosed for the optoelectronic semiconductor component and vice versa.

According to at least one embodiment of the optoelectronic semiconductor component, the latter comprises at least one optoelectronic semiconductor chip. The semiconductor chip here comprises a main emission side and a contact side opposite the main emission side. The contact side is provided with contact pads, wherein the contact pads serve in electrical contacting of the optoelectronic semiconductor component. In addition, the optoelectronic semiconductor chip comprises side faces which are oriented transversely of the main emission side and connect together the main emission side and the contact side.

According to at least one embodiment of the optoelectronic semiconductor component, the latter comprises a conversion element. The conversion element covers at least the main emission side of the semiconductor chip. In addition, the side faces of the semiconductor chip are partially or completely covered by the conversion element. The conversion element is provided to convert light from the semiconductor chip.

According to at least one embodiment of the optoelectronic semiconductor component, in plan view onto the main emission side the conversion element projects beyond the semiconductor chip in all directions. In plan view, the conversion element thus completely covers the semiconductor chip.

According to at least one embodiment of the optoelectronic semiconductor component, the conversion element applied to the semiconductor chip comprises outer edges and outer faces. The outer faces are here the sides of the conversion element remote from the semiconductor chip, and the outer edges are the connecting edges between the outer faces. The outer edges of the conversion element may be partially or completely rounded. In particular, all the outer edges of the conversion element may be completely rounded. The outer edges are here preferably rounded to the extent that the smallest distance between points on the outer edges and the semiconductor chip differs by no more than 5% or 10% or 20% from the distance between points on the outer faces and the semiconductor chip.

The radius of the rounded outer edges is preferably selected to be of similar magnitude to the average thickness of the conversion element. For example, the radius of the rounded outer edges amounts to at least 10% or 50% or 90% of the average thickness of the conversion element. Alternatively or in addition, the radius is at most 1000% or 200% or 110% of the average thickness of the conversion element. As a result of such rounded outer edges, the optical path for beams of light outcoupled from the semiconductor chip is equalized over the entire conversion element. This results in an improved color angle characteristic of the semiconductor component.

A method described here for producing optoelectronic semiconductor components and an optoelectronic semiconductor component described here are explained in greater detail below with reference to exemplary embodiments. Elements which are the same in the individual figures are indicated with the same reference numerals. The relationships between the elements are not shown to scale, however, but rather individual elements may be shown exaggeratedly large to assist in understanding.

Figure 3A:
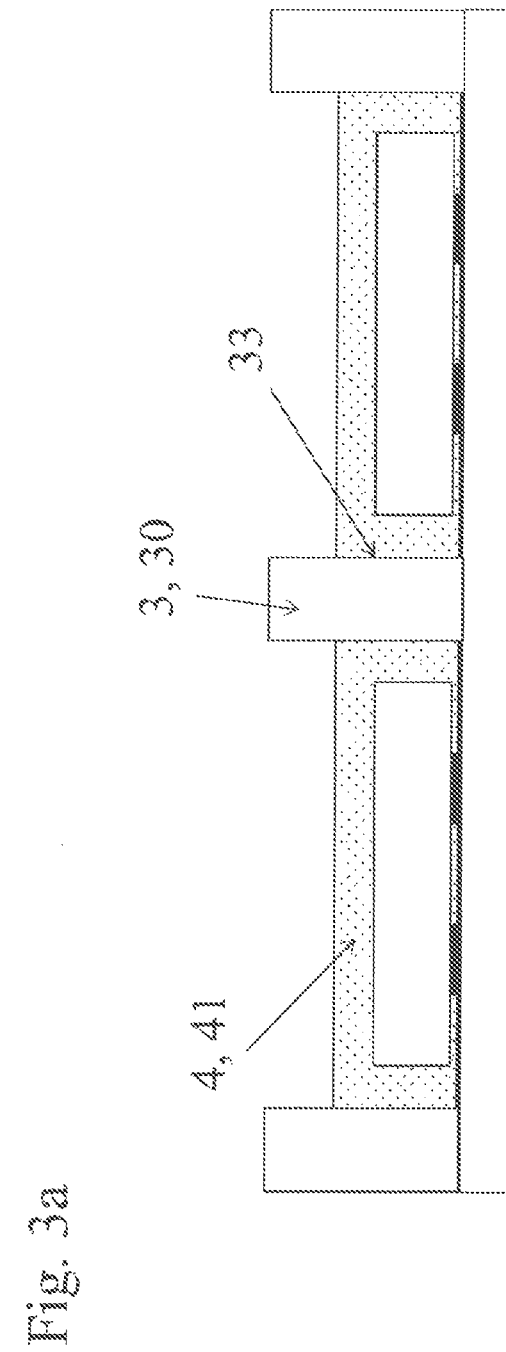
Figure 4:
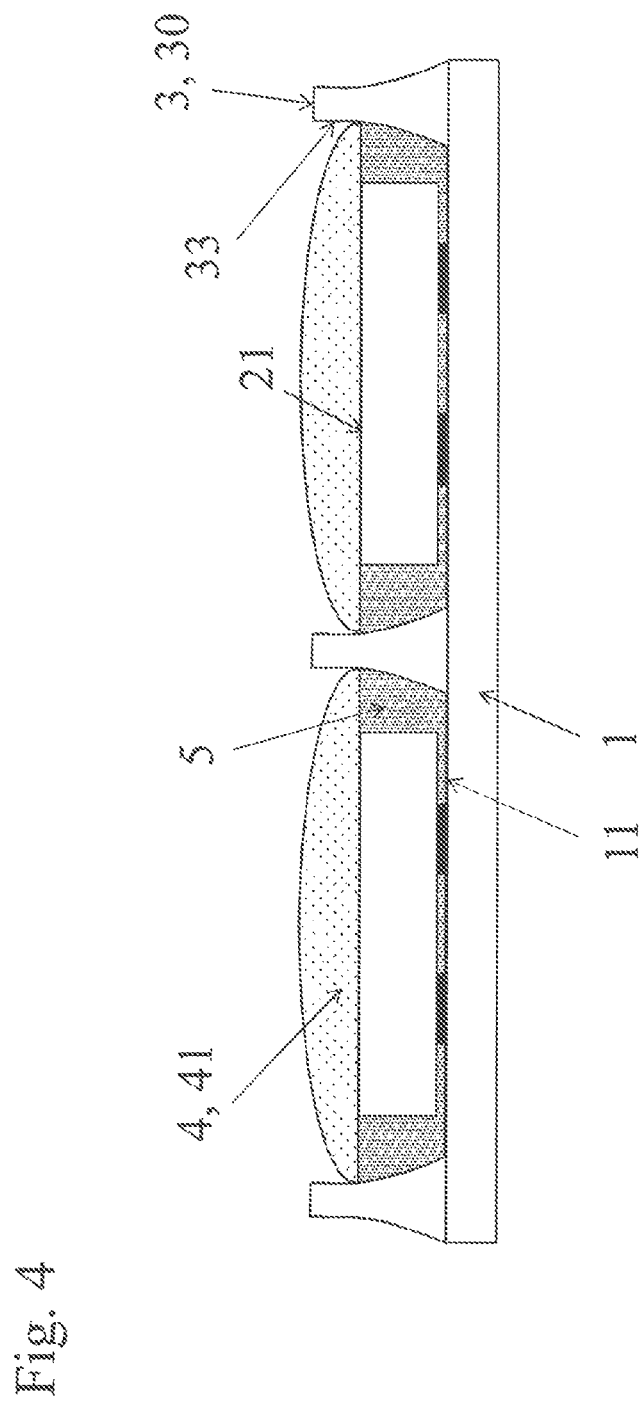
Figure 5B:
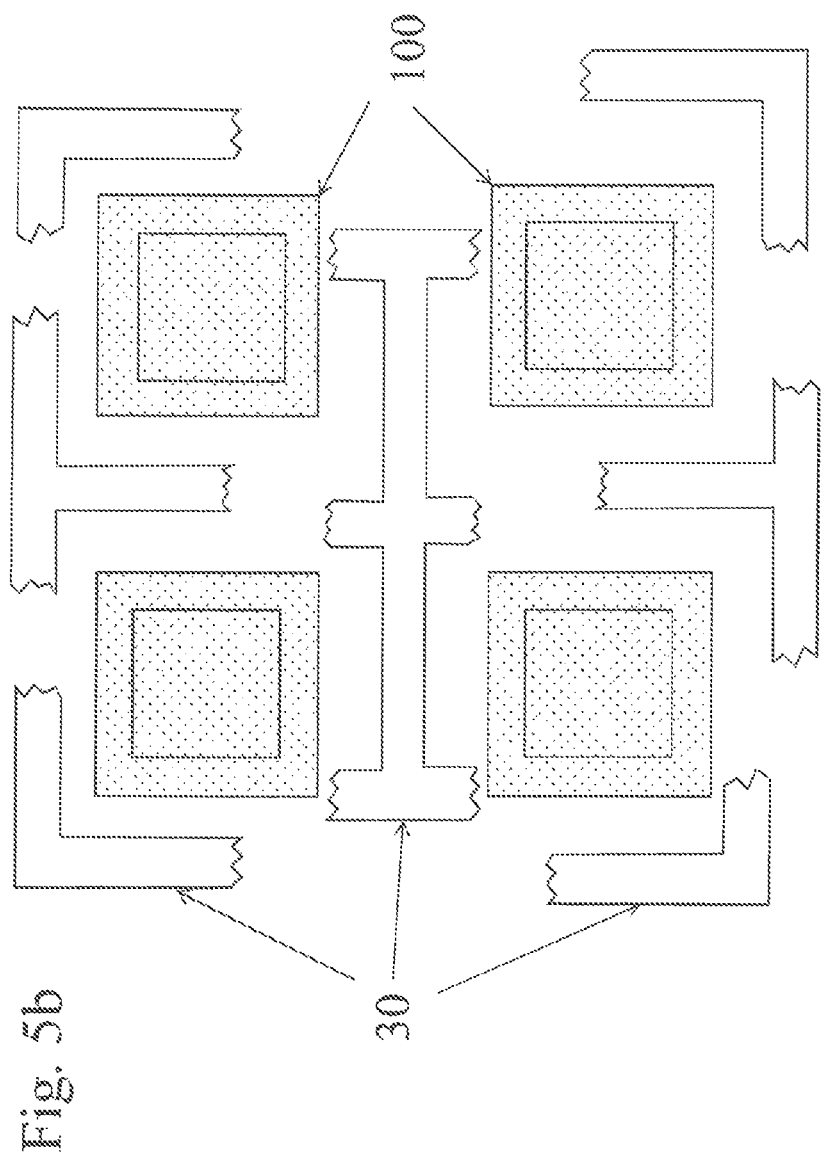

In the figures:

FIGS. 1a to 4 are cross-sectional views of exemplary embodiments of different method steps for producing optoelectronic components, FIGS. 5a and 5b are schematic plan views of exemplary embodiments of different method steps for producing optoelectronic components, FIGS. 6a to 6c are plan and side views of exemplary embodiments of optoelectronic components.

FIG. 1a shows an exemplary embodiment of a method step for producing optoelectronic components. A plurality of singulated semiconductor chips 2 are applied to a carrier 1 with a main carrier side 11. The semiconductor chips 2 here each comprise a main emission side 21 and a contact side 22 opposite the main emission side 21. The main emission side 21 and the contact side 22 are connected together by side faces 23 of the semiconductor chip 2. Contact pads 220 provided for electrical contacting of the semiconductor chips 2 are applied to the contact side 22 of each semiconductor chip 2. The semiconductor chips 2 are applied in such a way to the carrier 1 that in each case the contact side 22 faces the main carrier side 11.

In the method step of FIG. 1b, a further method step is shown. An organic mask layer 31 is applied onto and between the semiconductor chips 2. The mask layer 31 here preferably completely covers exposed side faces 23 and the main emission side 21. The mask layer 31 is for example a photosensitive coating layer 31. The thickness of the coating layer amounts for example to 200 µm.

FIG. 1c shows a further method step. In this step, the coating layer 31 is patterned and cured. The patterning may for example proceed by means of free space optics, LDI for short. By patterning the coating layer 31, a mask frame 3 is produced which consists of a plurality of partition walls 30 arranged in a grid like manner. Moreover, the patterning exposes the semiconductor chips 2.

In the method step according to FIG. 1c, the partition walls 30 are shown in cross-sectional view, wherein the main direction of extension of the partition walls is perpendicular to the plane of the drawing. The partition walls 30 comprise flanks 33, wherein the flanks 33 extend transversely of the main carrier side 11 and each face a semiconductor chip 2. Viewed from the respective semiconductor chips 2, the closest flanks 33 are each curved concavely. Thus, the width of the partition walls 30 firstly decreases in a direction away from the main carrier side 11 to a minimum width and then increases again. The width of the partition walls 30 in the region of the main carrier side 11 and in the region furthest from the main carrier side 11 is for example twice as great as the minimum width. The minimum width is for example arranged at a height above the main carrier side 11 which amounts to between 40% and 60% of the total height of the partition wall 30.

The concavely shaped partition walls 30 shown in FIG. 1c may for example be produced using grayscale lithography. To this end, the carrier 1 may for example be transparent, such that the coating layer 31 may also be exposed to light by the carrier 1.

In FIG. 1c, the partition walls 30 are moreover spaced laterally from the semiconductor chips 2. In this way, the semiconductor chips 2 are surrounded by an interspace, in which the main carrier side 11 of the carrier 1 is exposed.

In the method step of FIG. 1d, the semiconductor chips 2 are potted with a conversion material 4, from which a conversion element 41 is formed for each semiconductor chip 2. In the process, the conversion material 4 fills the intermediate regions between the semiconductor chips 2 and the partition walls 30 and partially or completely covers the main emission sides 21 of the semiconductor chips 2. In particular, the conversion elements 41 in FIG. 1d each form-fittingly surround the side faces 23 and the main emission sides 21 of the semiconductor chips 2. The conversion elements 41 furthermore form-fittingly follow the shape of the flanks 33 of the partition walls 30, such that the lateral outer faces of the conversion elements 41 have a convex curvature when viewed from the semiconductor chips 2. The thickness of the layer of conversion material 4 on the main emission sides 21 of the semiconductor chips 2 amounts in FIG. 1d for example to 70 µm.

Figure 1E:
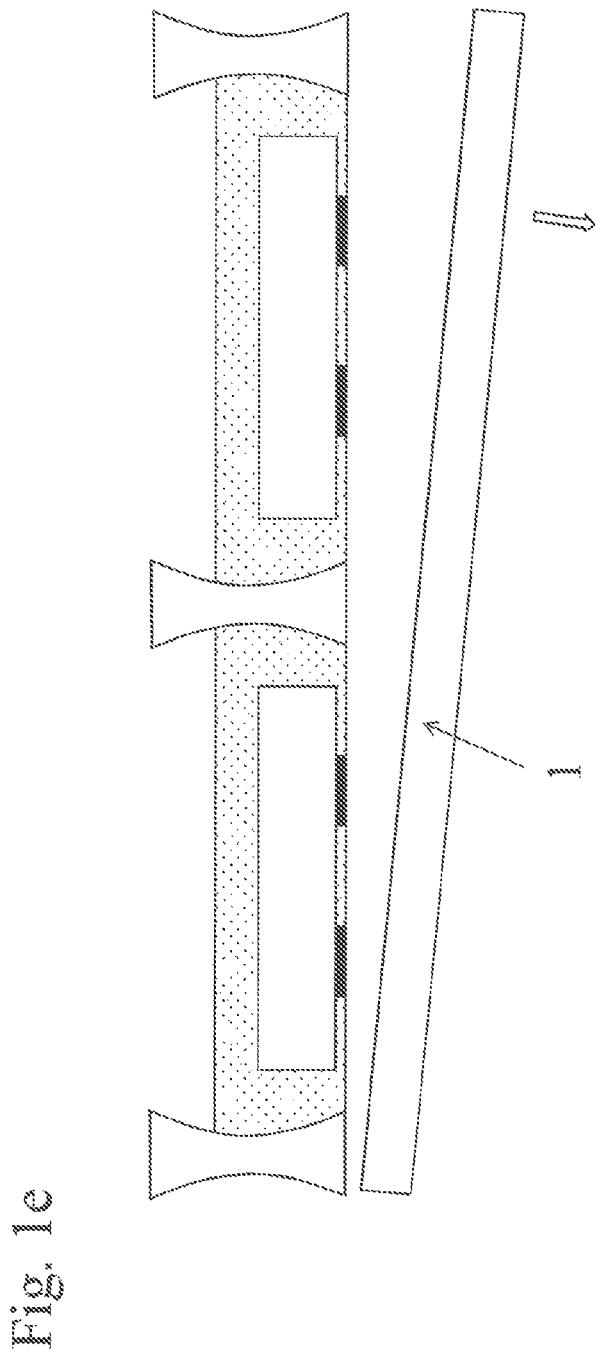

In the method step of FIG. 1e, the semiconductor chips 2 are detached from the carrier 1 after potting with the conversion material 4. Through detachment of the carrier 1, parts of the contact side 22 are exposed, in particular parts of the contact pads 220. This enables subsequent electrical contacting of the semiconductor chips 2. In FIG. 1e the carrier 1 is peeled away in one piece from the semiconductor chips 2. Alternatively, however, it is also possible to erode the carrier 1 layer-by-layer or to detach it by means of a solvent.

Figure 1F:
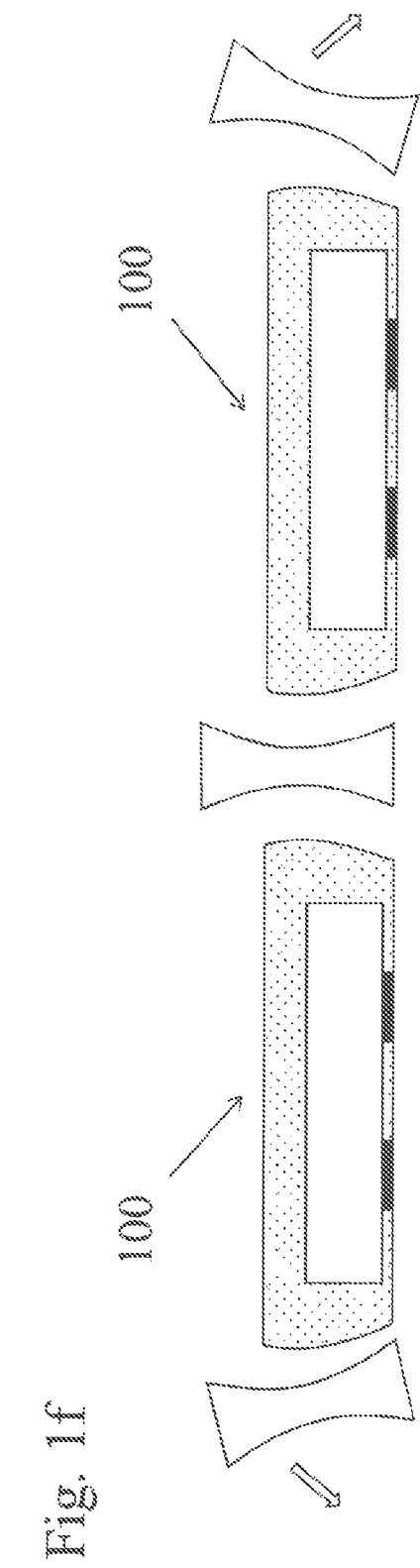

FIG. 1f shows a further method step, in which the finished potted semiconductor components 100, consisting of the semiconductor chips 2 and the conversion elements 41, are singulated. When singulating the semiconductor components 100, the mask frame 3 and in particular the partition walls 30 are detached from the semiconductor components 100, wherein the mask frame 3 may be destroyed. Detachment of the mask frame 3 may for example proceed by a solvent or by breaking of the partition walls 30.

The exemplary embodiment according to FIG. 2a differs from the method step of FIG. 1d in that the carrier 1 takes the form of an adhesive film 1. An adhesive layer 12 is in this case applied to the adhesive film 1. The adhesive layer 12 has a thickness of 10 µm, for example. The semiconductor chips 2 are here pressed so far into the adhesive layer 12 that the contact pads 220 partly penetrate into the adhesive layer 12. The adhesive layer 12 here protects the contact pads 220 from the conversion material 4. In the method described here, the regions of the contact side 22 between the contact pads 220 may be wholly covered with the conversion material 4. Alternatively, it is also possible for these regions not to be wetted by the conversion material 4.

The exemplary embodiment of FIG. 2b differs from the method step shown in FIG. 1d in that, prior to the conversion material 4 being poured in, a reflective material was introduced into the interspace between the semiconductor chips 2 and partition walls 30. The reflective material here forms a reflective layer 5, which covers parts of the side faces 23 of the semiconductor chips 2. In plan view onto the main emission side 21 of the semiconductor chips 2, the reflective layer 5 for example forms an uninterrupted path around the semiconductor chip 2. In FIG. 2b the height of the reflective layer 5 when viewed from the main carrier side 11 is for example 50 µm. The conversion element 41 is formed adjacent the reflective layer 5. In this case, the conversion element 41 is in direct contact with the reflective layer 5. Between the reflective layer 5 and the conversion element 41 there is no gap or space. At the outer faces the conversion element 41 terminates flush with the reflective layer 5. The reflective layer 5 and the conversion element 41 here form-fittingly follow the shape of the partition walls 30. Furthermore, on the outer face of the conversion element 41 there is no seam structure which can take the form, for example, of a raised portion or indentation. There is also no such seam structure to be found in the transitional region between the reflective layer 5 and the conversion element 41.

As in FIG. 2b, in the exemplary embodiment of FIG. 2c a reflective layer 5 has been formed against the side faces 23 of the semiconductor chip 2 prior to application of the conversion material 4. In this case the reflective layer 5 terminates flush with the main emission side 21 of the semiconductor chip. The conversion element 41 is applied onto the reflective layer 5 and the main emission side 21. The conversion element 41 here comprises a curved outer face, which is lenticular in form. Such a lenticular outer face may be achieved for example in that high viscosity or thixotropic material is used for the conversion material 4.

The exemplary embodiment of FIG. 3a differs from the method step of FIG. 1d in that the flanks 33 of the side walls 30 are planar or flat, i.e. are not curved. The conversion element 41 encircling the flanks 33 thereby likewise forms planar or flat lateral outer faces.

FIG. 3b shows the finished devices 100, after removal of the carrier 1 and the mask frame 3 from the exemplary embodiment of FIG. 3a. The finished devices 100 comprise conversion elements 41 with planar or flat outer faces. The outer edges connecting the outer faces are not rounded, but rather sharp-edged.

FIG. 4 shows a further exemplary embodiment, which is similar to the method step of FIG. 2c. The difference is that in FIG. 4 the width of the partition walls 30 decreases monotonically in the direction away from the main carrier side 11 and does not increase again. The curvature of the flanks 33 is nonetheless convex. In FIG. 4 the conversion elements 41 project beyond the partition walls 30 in a direction away from the main carrier side 11, but the conversion elements 41 of two adjacent semiconductor chips 2 are not contiguous or in direct contact.

In the exemplary embodiment of FIG. 5a, a method step for producing the optoelectronic semiconductor components 100 is viewed in plan view, onto the main emission sides 21 of the semiconductor chips 2. The mask frame 3 is formed from a plurality of partition walls 31 arranged in a grid. The semiconductor chips 2 are surrounded all round by the partition walls 31. The partition walls 30 are here not in direct contact with the semiconductor chips 2, but rather are separated from the semiconductor chips 2 by an interspace. Furthermore, the interspace between the semiconductor chips 2 and the partition walls 30 is filled with a conversion material 4. The conversion material 4 is moreover applied onto the main emission sides 21 of the semiconductor chips 2.

In the exemplary embodiment of FIG. 5b, a further method step is shown for producing the optoelectronic components, in plan view onto the main emission sides 21 of the semiconductor chips 2. In the method step the finished semiconductor components 100 are detached from the mask frame. On detachment, the mask frame 3 is destroyed, in particular the partition walls 30 of the mask frame 3 are broken apart, such that the semiconductor components 100 can be singulated.

FIG. 6a shows an exemplary embodiment of an optoelectronic semiconductor component 100, in plan view onto the main carrier side 21. In this case, the main emission side 21 of the semiconductor chip 2 is rectangular. The conversion element 41 is arranged on the main emission side 21, wherein the conversion element 41 projects beyond the main emission side 21 in all directions. The conversion element 41 is here likewise rectangular in shape.

In the exemplary embodiment of FIG. 6b, the semiconductor component 100 is shown in side view onto the side face 23 of the semiconductor chip 2. The conversion element 41 here has a rectangular cross-sectional shape, wherein the corners of the rectangular furthest from the contact side 22 are rounded.

The conversion element 41 in FIG. 6b covers parts of the side faces 23 of the semiconductor chip 2 and projects beyond the semiconductor chip 2 in a direction away from the main emission side 21. In a direction towards the contact side 22 of the semiconductor chip 2 a reflective layer 5 is arranged downstream of the conversion element 41. The reflective layer 5 here likewise covers parts of the side faces 23 of the semiconductor chip 2.

In the exemplary embodiments of both FIG. 6a and FIG. 6b, the conversion element 41 comprises outer edges and outer faces. The outer edges are here at least partly rounded to the extent that, for the conversion element 41, the smallest distance between points on the outer edges of the conversion element 41 and the semiconductor chip 2 differs by less than 20% from the smallest distance between points on the outer faces of the conversion element 41 and the semiconductor chip 2. Such rounding of the outer edges in turn equalizes the optical path length in the conversion element 41 for light outcoupled from the semiconductor chip 2 over the entire semiconductor component 100. Because of the rounded outer edges, some corners of the conversion element 41 appear rounded in the plan view of FIG. 6a and/or in the side view of FIG. 6b.

FIG. 6c shows an exemplary embodiment of an optoelectronic semiconductor component 100 in side view onto the side face 23 of the semiconductor chip 2. Unlike in FIG. 4b, here the side faces 23 are covered from the contact side 22 as far as to the main emission side 21 with the reflective layer 5. The reflective layer 5 thus terminates flush with the main emission side 21. A conversion element 41 is applied onto the main emission side 21. The conversion element 41 here has a dome-shaped or lenticular outer face. In addition, the conversion element 41 terminates flush with the reflective layer 5 at the outer faces. The lateral outer faces of the conversion element 41 and of the reflective layer 5 here have a convex cross-sectional shape. In particular, the layer thickness of the reflective layer 5 applied onto the side faces 23 initially increases in a direction away from the contact side 22 and then decreases again. In contrast to what is shown in FIG. 6c, the side faces of the semiconductor chip 2 may also be predominantly or exclusively covered with the conversion element 41.

The invention described here is not restricted by the description given with reference to the exemplary embodiments. Rather, the invention encompasses any novel feature and any combination of features, including in particular any combination of features in the claims, even if this feature or this combination is not itself explicitly listed in the claims or exemplary embodiments.

This patent application claims priority from German patent application 10 2014 102 293.9, the disclosure content of which is hereby included by reference.

The invention claimed is:

1. A method for producing optoelectronic semiconductor components, the method comprising:
   providing a carrier having a main carrier side;
   providing a plurality of singulated optoelectronic semiconductor chips, wherein each semiconductor chip includes a main emission side and a contact side opposite to the main emission side, and wherein the contact side is configured for electrical contacting of the semiconductor chip;
   disposing the singulated semiconductor chips on the main carrier side such that the contact sides face the main carrier side;
   disposing a mask frame at least in regions between the semiconductor chips, wherein the mask frame is a grid of partition walls, and wherein each semiconductor chip is completely surrounded by the partition walls of the mask frame when viewed in plan view of the main carrier side;
   potting the semiconductor chips with a conversion material such that conversion elements are formed on the semiconductor chips which at least partly cover the main emission sides of the semiconductor chips;
   removing the carrier such that the contact sides of the semiconductor chips are at least partly exposed; and
   subsequently removing the optoelectronic semiconductor components from the mask frame by destroying the mask frame.

2. The method according to claim 1, wherein disposing the mask frame comprises:
   applying a photosensitive coating layer onto and between the semiconductor chips;
   patterning the coating layer such that the semiconductor chips are at least partially exposed and surrounded by the mask frame; and
   curing the coating layer such that the finished coating layer is dimensionally stable and rigid.

3. The method according to claim 1, wherein the partition walls of the mask frame comprise flanks, wherein the flanks extend transversely to the main carrier side, wherein each flank faces a semiconductor chip, wherein the flanks are concavely curved such that widths of the partition walls decrease and then again increase in a direction leading away from the main carrier side, and wherein the partition walls are broken or fractured when the semiconductor components are removed from the mask frame.

4. The method according to claim 1, wherein the semiconductor chips are laterally spaced apart from the partition walls such that, in plan view, the semiconductor chips are completely surrounded by interspaces, wherein the interspaces are filled with the conversion material such that the conversion elements at least partly embrace the main emission sides and expose side faces of the semiconductor chips, and wherein the conversion elements form-fittingly follow a shape of flanks of the partition walls at least in part such that outer faces of the conversion elements remote from the semiconductor chips comprise at least partially negative shapes of the flanks.

5. The method according to claim 4, further comprising, prior to potting semiconductor chips with the conversion material, introducing a reflective material into the interspaces between the semiconductor chips and the mask frame such that the exposed side faces of the semiconductor chips are covered at least in part with a reflective layer.

6. The method according to claim 1, wherein the conversion element does not comprise any seam structures which occur as raised portions or indentations in the conversion element.

7. The method according to claim 1, wherein the mask frame has a height perpendicular to the main carrier side which is greater than a height of the semiconductor chips, and wherein the semiconductor chips are potted with the conversion material only to an extent that the conversion elements of two adjacent semiconductor chips are not contiguous.

8. The method according to claim 1, wherein the conversion element forms a dome-shape and/or lenticular shape on the main emission side of the semiconductor chip.

9. The method according to claim 1, wherein the carrier is an adhesive film with an adhesive layer located at the main carrier side, wherein contact pads are raised portions on the contact sides of the semiconductor chips, and wherein, after disposing the semiconductor chips onto the adhesive film, the contact pads are pressed at least in part into the adhesive layer.

10. The method according to claim 9, wherein the adhesive layer has a thickness of 2 µm to 50 µm, wherein the contact pads have a thickness of 5 µm to 50 µm, and wherein the contact pads penetrate the adhesive layer between 1 µm and 5 µm deep.

11. The method according to claim 9, wherein regions of the contact sides which are arranged between the contact pads are covered with the conversion material or a reflective material.

12. The method according to claim 1, wherein the semiconductor chips have a lateral extent along the main emission side between 300 µm and 1000 µm, wherein a height of the semiconductor chips amounts to between 100 µm and 400 µm, and wherein the conversion element on the semiconductor chips has a thickness between 20 µm and 250 µm.

13. The method according to claim 1, wherein the conversion material is a matrix material comprising silicone with inorganic luminescent particles introduced therein, and wherein the luminescent particles are configured to convert light of a first wavelength range emitted by the semiconductor chips at least partly into light of a second wavelength range such that the semiconductor component is configured to emit mixed light.

14. A method for producing optoelectronic semiconductor components, the method comprising:
    providing a carrier having a main carrier side;
    providing a plurality of singulated optoelectronic semiconductor chips, wherein each semiconductor chip includes a main emission side and a contact side opposite to the main emission side, wherein the contact side is configured for electrical contacting of the semiconductor chip;
    disposing the singulated semiconductor chips on the main carrier side such that the contact sides face the main carrier side;
    disposing a mask frame at least in regions between the semiconductor chips, wherein the mask frame is a grid of partition walls, and wherein each semiconductor chip is completely surrounded by the partition walls of the mask frame when viewed in plan view of the main carrier side;
    potting the semiconductor chips with a conversion material such that conversion elements are formed on the semiconductor chips which at least partly cover the main emission sides of the semiconductor chips;
    removing the carrier such that the contact sides of the semiconductor chips are at least partly exposed; and
    subsequently removing the optoelectronic semiconductor components from the mask frame by destroying the mask frame,
    wherein the partition walls of the mask frame comprise flanks, wherein the flanks extend transversely to the main carrier side, wherein each flank faces a semiconductor chip, wherein the flanks are concavely curved such that widths of the partition walls decrease and then again increase in a direction leading away from the main carrier side, and wherein the partition walls are broken or fractured when the semiconductor components are removed from the mask frame.

* * * * *

UNITED STATES PATENT AND TRADEMARK OFFICE
CERTIFICATE OF CORRECTION

PATENT NO. : 10,008,639 B2
APPLICATION NO. : 15/120457
DATED : June 26, 2018
INVENTOR(S) : Britta Goeoetz It is certified that error appears in the above-identified patent and that said Letters Patent is hereby corrected as shown below:

On the Title Page

Item (73) Assignee, Line 1, delete "SEMICONDUCTOR" and insert --SEMICONDUCTORS--.

Signed and Sealed this
Fourth Day of September, 2018

Andrei Iancu
*Director of the United States Patent and Trademark Office*